(12) United States Patent
Fujioka et al.

(10) Patent No.: US 7,057,959 B2
(45) Date of Patent: *Jun. 6, 2006

(54) SEMICONDUCTOR MEMORY HAVING MODE REGISTER ACCESS IN BURST MODE

(75) Inventors: Shinya Fujioka, Kawasaki (JP); Shinichi Yamada, Kawasaki (JP); Kotoku Sato, Kawasaki (JP); Jun Ohno, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/001,619

(22) Filed: Dec. 2, 2004

(65) Prior Publication Data

US 2005/0094480 A1 May 5, 2005

Related U.S. Application Data

(63) Continuation of application No. 10/654,999, filed on Sep. 5, 2003, now Pat. No. 6,842,391.

(30) Foreign Application Priority Data

Sep. 13, 2002 (JP) ............................ 2002-268975

(51) Int. Cl.
*G11C 7/22* (2006.01)
*G11C 5/14* (2006.01)

(52) U.S. Cl. .................. 365/221; 365/219; 365/220; 365/233; 365/229; 365/227

(58) Field of Classification Search ............... 365/229, 365/227, 228, 219, 220, 221, 233
See application file for complete search history.

(56) References Cited

U.S. PATENT DOCUMENTS 6,314,049 B1  11/2001  Roohparvar ............. 365/233
6,842,391 B1 * 1/2005  Fujioka et al. ............ 365/219

FOREIGN PATENT DOCUMENTS

JP        2000-011652 A  *  1/2000

OTHER PUBLICATIONS

Patent Abstract of Japanese Publication No. 2000-011652, dated Jan. 14, 2000.

* cited by examiner

*Primary Examiner*—Andrew Q. Tran
(74) *Attorney, Agent, or Firm*—Arent Fox PLLC

(57) ABSTRACT

A method for controlling a semiconductor memory in which a mode register can be set in a burst mode. To set an operation mode in the burst mode, the semiconductor memory is changed first from the burst mode, through a power-down mode, to a standby mode of non-burst mode. Then the semiconductor memory is changed to a mode register set mode to set the mode register when commands are input in the same predetermined sequence that is used in the non-burst mode.

2 Claims, 5 Drawing Sheets

FIG. 3A

| Add. | 20 | 19 | 18 | 17 | 16 | 15 | 14 | 13 | 12 |
|---|---|---|---|---|---|---|---|---|---|
| Func. | Partial Mode | | Data Length | | Mode | Read Latency Count | | | Reset |
| Sym. | PM | | DL | | MD | RLC | | | RS |

FIG. 3B

| Name | Description |
|---|---|
| PM | 00 :16M  01 :8M  10 :Full Chip  11 :0M(Def.) |
| DL | 00 :8word burst  01 :16word burst  10 :32word burst  11 :Continuous burst |
| MD | 0 :Synchronous Burst Enabled<br>1 :Asynchronous Page Enabled(Def.) |
| RLC | 000 :Latency Count=2  001 :Latency Count=3<br>010 :Latency Count=4  011 :Latency Count=5 |
| RS | 0 :Reset Enabled(Def.)<br>1 :Reset Disabled |

| MODE | CE2 | /CE1 | /OE | /WE | /ADS | /LB | /UB | DQ$_{0-7}$ | DQ$_{8-15}$ | Retention |
|---|---|---|---|---|---|---|---|---|---|---|
| Power Down/Reset | L | H | X | X | X | X | X | HiZ | HiZ | No/Partial |
| Standby | H | H | X | X | X | X | X | HiZ | HiZ | Yes |
| Output Disable | H | L | H | H | X | X | X | HiZ | HiZ | Yes |
| Read | H | L | L | H | X | L | L | Dout | Dout | Yes |
| No Read | H | L | L | H | X | H | H | HiZ | HiZ | Yes |
| Lower Byte Read | H | L | L | H | X | L | H | Dout | HiZ | Yes |
| Upper Byte Read | H | L | L | H | X | H | L | HiZ | Dout | Yes |
| Write | H | L | X | L | X | L | L | Din | Din | Yes |
| Abort Write | H | L | X | L | X | H | H | Invalid | Invalid | Yes |
| Lower Byte Write | H | L | X | L | X | L | H | Din | Invalid | Yes |
| Upper Byte Write | H | L | X | L | X | H | L | Invalid | Din | Yes |
| Illegal | H | L | L | L | X | X | X | --- | --- | --- |

FIG. 4

SEMICONDUCTOR MEMORY HAVING MODE REGISTER ACCESS IN BURST MODE

This is a Continuation of application Ser. No. 10/654,999 now U.S Pat. No. 6,842,391 filed Sep. 5, 2003. The disclosure of the prior application(s) is hereby incorporated by reference herein in its entirety.

CROSS-REFERENCE TO RELATED APPLICATIONS

This application is based upon and claims the benefits of priority from the prior Japanese Patent Application No. 2002-268975, filed on Sep. 3, 2002, the entire contents of which are incorporated herein by reference.

BACKGROUND OF THE INVENTION (1) Field of the Invention

This invention relates to a semiconductor memory and a method for controlling such a semiconductor memory and, more particularly, to a semiconductor memory of a dynamic random access memory (DRAM) type having a static random access memory (SRAM) interface and a method for controlling such a semiconductor memory.

(2) Description of the Related Art

In recent years attention has been riveted to DRAMs (pseudo SRAMs), which use a DRAM cell array and which have an SRAM interface, as memories most suitable for cellular phones etc. because of low power consumption, the feasibility of large storage capacity, cheapness, and so on.

On the other hand, synchronous DRAMs (SDRAMs) in which a memory bus operates in synchronization with a clock signal having a certain period have been used as memories in personal computers (PCs) and the like.

An operation mode of a pseudo SRAM or an SDRAM is set by a mode setting control circuit including a mode register described later. Setting an operation mode includes setting the number of megabytes of the entire memory chip to be refreshed (setting partial mode) and setting the number of clocks after a command being input after which the reading or writing of data is begun (setting latency).

One of operation modes of an SDRAM is burst mode. In burst mode, data is continuously written or read in synchronization with a clock signal. To set burst mode, burst length BL, being the number of times data is output or input, corresponding to one access command and the like are set on the basis of an external signal.

With SDRAMs a dedicated command called a mode register set command has been used in conventional methods for controlling a mode register (for example, refer to Japanese unexamined Patent Publication No. 2000-011652 (the paragraph number [0013] and FIG. 1)). With pseudo SRAMs, the method of preparing a dedicated command input to a dedicated pin or the method of combining a legal command, such as a read command or a write command, a specific address, and a specific data pattern has been used. In addition, the method of combining illegal commands not recognized as commands or the method of combining a legal command and a specific address can be used.

With pseudo SRAMs, however, setting a mode register by combining illegal commands will necessitate a change on the controller side. This causes a problem with compatibility with pseudo SRAMs used only in non-burst mode.

The method of preparing a dedicated command input to a dedicated pin will also necessitate a change on the controller side. Moreover, the size of a chip may increase.

The method of combining legal commands will cause the following problem in burst mode. When a command is input once at write or read operation time in burst mode, data with burst length BL set in a mode register will be input or output in synchronization with a clock signal. Therefore, to continuously input commands, each time interrupt operation must be performed. This increases the scale of circuits, resulting in an increase in the area of a chip.

Therefore, it has been difficult to use conventional pseudo SRAMs in burst mode.

SUMMARY OF THE INVENTION

The present invention was made under the background circumstances as described above. An object of the present invention is to provide a method for controlling a semiconductor memory which can set a mode register in the sequence common to non-burst mode and burst mode.

Another object of the present invention is to provide a semiconductor memory in which a mode register can be set in the sequence common to non-burst mode and burst mode.

In order to achieve the above first object, a method for controlling a semiconductor memory is provided. This method for controlling a semiconductor memory comprises the steps of changing the semiconductor memory from burst mode, through power-down mode, to standby mode of non-burst mode in the case of setting a mode register for setting an operation mode in the burst mode, changing the semiconductor memory from the standby mode of the non-burst mode to mode register set mode in the case of commands being input in predetermined sequence in the standby mode of the non-burst mode, and setting the mode register according to input from the outside.

In order to achieve the above second object, a semiconductor memory is provided. This semiconductor memory comprises a mode setting control circuit with a mode register to set an operation mode for setting the mode register in the case of commands being input in predetermined sequence in standby mode of non-burst mode and a power-down control circuit for changing the semiconductor memory from standby mode of burst mode, through power-down mode, to the standby mode of the non-burst mode.

The above and other objects, features and advantages of the present invention will become apparent from the following description when taken in conjunction with the accompanying drawings which illustrate preferred embodiments of the present invention by way of example.

BRIEF DESCRIPTION OF THE DRAWINGS

FIGS. 3A and 3B are views for describing operation modes set in a mode register, FIG. 3A being a view for describing assignment of functions, FIG. 3B being a view for describing each function.

FIG. 4 is a view showing an example of a command table.

DESCRIPTION OF THE PREFERRED EMBODIMENTS

Embodiments of the present invention will now be described with reference to the drawings.

Figure 1:
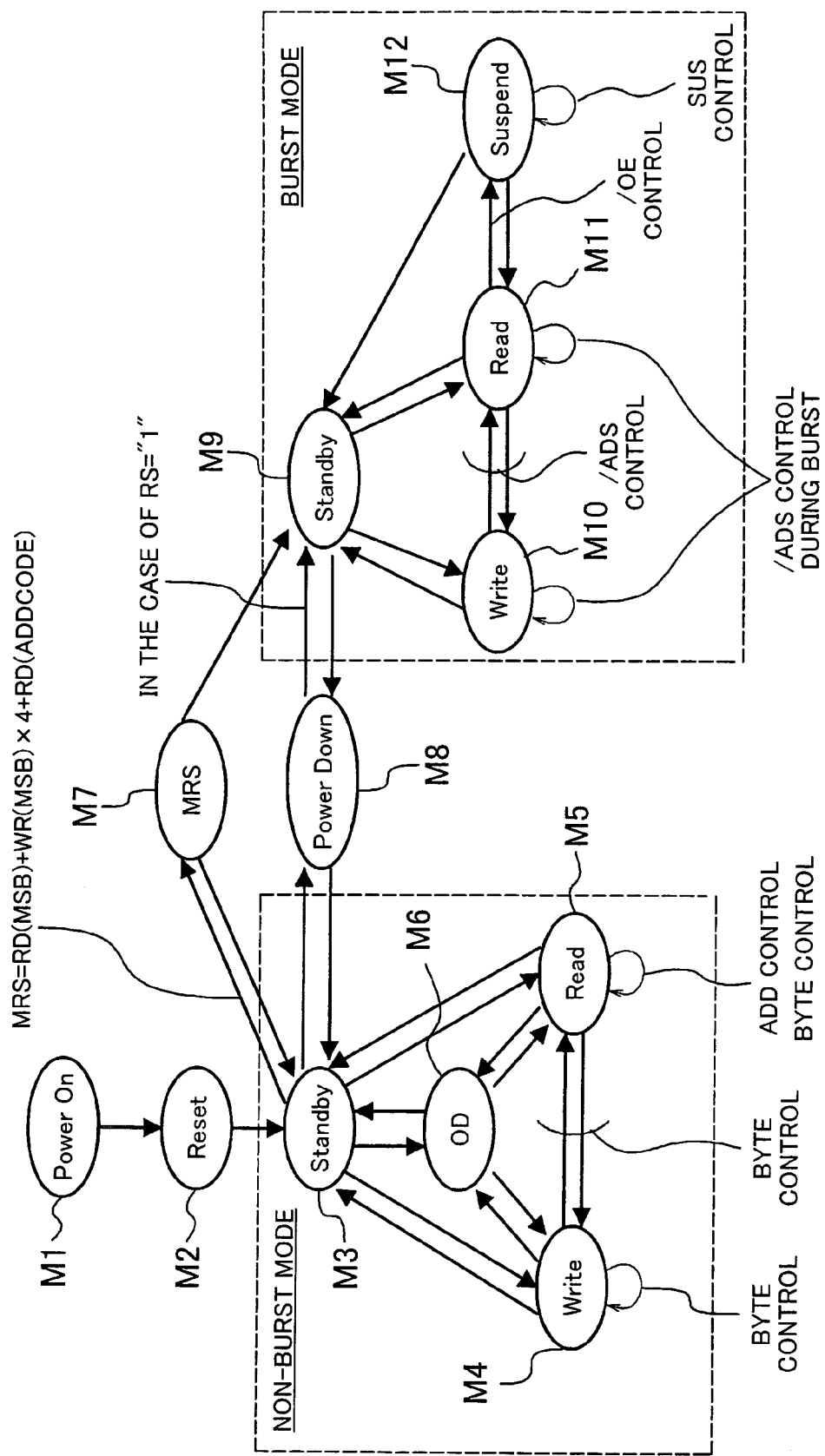
FIG. 1 is a state transition diagram showing a method for controlling a semiconductor memory, according to an embodiment of the present invention.

FIG. 1 is a state transition diagram showing a method for controlling a semiconductor memory, according to an embodiment of the present invention.

Each symbol "M" in FIG. 1 represents a mode.

Figure 2:
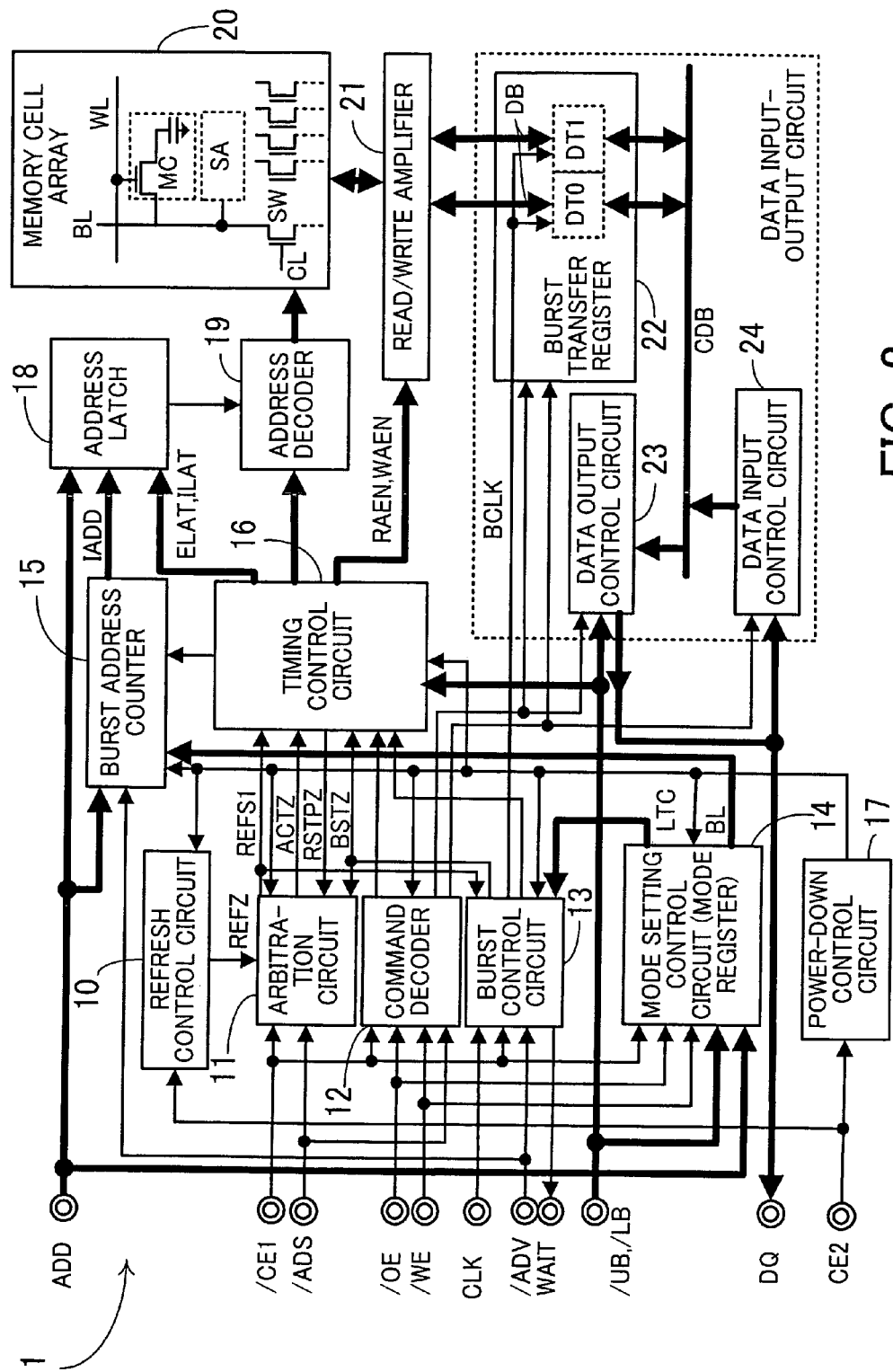
FIG. 2 is a view showing the structure of a semiconductor memory according to an embodiment of the present invention.

FIG. 2 is a view showing the structure of a semiconductor memory according to an embodiment of the present invention.

In FIG. 2, a signal line indicated by a thick line includes a plurality of bits. Double circles on the left-hand side of FIG. 2 indicate external input terminals. A signal with "/" at the head of its name indicates negative logic. A signal with "Z" at the tail of its name indicates positive logic.

Now, the function of each section in a semiconductor memory 1 according to an embodiment of the present invention shown in FIG. 2 will be described. Afterward, operation performed in the semiconductor memory 1 and how to control the semiconductor memory 1 will be described with FIG. 1.

The semiconductor memory 1 has DRAM memory cells MC and is a pseudo SRAM having an SRAM interface. The semiconductor memory 1 comprises a refresh control circuit 10, an arbitration circuit 11, a command decoder 12, a burst control circuit 13, a mode setting control circuit 14, a burst address counter 15, a timing control circuit 16, a power-down control circuit 17, an address latch 18, an address decoder 19, a memory cell array 20, a read/write amplifier 21, a burst transfer register 22, a data output control circuit 23, and a data input control circuit 24.

The refresh control circuit 10 contains a timer (not shown). The refresh control circuit 10 outputs a refresh request signal REFZ for refreshing a memory cell MC in the memory cell array 20 in a predetermined cycle. Moreover, the refresh control circuit 10 inputs a chip enable signal CE2. When this signal is at the low level, the semiconductor memory 1 makes a transition to power-down mode and operation similar to setting in FIG. 3A or 3B is performed.

The arbitration circuit 11 compares the order in which a refresh request signal REFZ and an access command were input, and outputs a control signal corresponding to one of the two which was input before the other. If refresh operation is performed, then the arbitration circuit 11 outputs a refresh start signal REFS1 and an active signal ACTZ. If a process corresponding to the access command is performed, then the arbitration circuit 11 outputs an active signal ACTZ. When a refresh stop signal RSTPZ output from the timing control circuit 16 at the time of the refresh operation being completed is input, the arbitration circuit 11 stops outputting the refresh start signal REFS1. The access command is supplied from an external input terminal at read or write operation time or in burst mode in which the memory cell array 20 is continuously accessed to continuously perform read or write operation. Moreover, the access command is recognized when a chip enable signal /CE1 and an address status signal /ADS are at the low level. With burst access in burst mode, a plurality of pieces of data will be output or input by inputting an access command once.

In the semiconductor memory 1, an address signal ADD supplied when an address status signal /ADS is at the low level is considered to be valid and an address signal ADD supplied when an address status signal /ADS is at the high level is considered to be invalid. Moreover, the semiconductor memory 1 has the SRAM interface, so a row address and column address are supplied at the same time by an address signal ADD.

The command decoder 12 decodes a chip enable signal /CE1, an output enable signal /OE, and a write enable signal /WE at the time of an address status signal /ADS being at the low level and outputs control signals corresponding to the results of the decoding to the timing control circuit 16, the data output control circuit 23, the data input control circuit 24, and the burst transfer register 22.

The burst control circuit 13 receives an external clock signal CLK, a chip enable signal /CE1, a burst address advance signal /ADV, and a latency signal LTC from the mode setting control circuit 14 and outputs a burst signal BSTZ, a burst clock signal BCLK (strobe signal), a timing signal sent to the timing control circuit 16, and a wait signal WAIT. The wait signal WAIT is output to the outside of the semiconductor memory 1.

The burst signal BSTZ will be output in burst mode.

The mode setting control circuit 14 receives a chip enable signal /CE1, an output enable signal /OE, a write enable signal /WE, an upper byte signal /UB, a lower byte signal /LB, and an address signal ADD and outputs a latency signal LTC and a burst length signal BL. The upper byte signal /UB or the lower byte signal /LB is used for masking part of data to be read or written.

In addition, the mode setting control circuit 14 is used for setting an operation mode of a pseudo SRAM and has a mode register which can be set from the outside.

FIGS. 3A and 3B are views for describing operation modes set in a mode register. FIG. 3A is a view for describing assignment of functions. FIG. 3B is a view for describing each function.

As shown in FIG. 3A, addresses Add12 through Add20, for example, are assigned to the mode register as codes for setting an operation mode. In this example, the address Add12 is used for setting a reset function (RS). The value "0" indicates the state in which reset can be performed and the value "1" indicates the state in which reset cannot be performed. The value of the address Add12 is "0" after start sequence. Details will be described later. The addresses Add13 through Add15 indicate a read latency count (RLC). That is to say, the addresses Add13 through Add15 are used for setting, for example, the number of pulses of an external clock signal CLK after a read command being input after which data is read. The values "000," "001," "010," and "011" of the addresses Add13 through Add15 indicate the latency counts 2, 3, 4, and 5 respectively. For example, if a latency count is four, then data will be read in synchronization with the leading edge of the fourth pulse of an external clock signal CLK after a read command is input.

The address Add16 is used for setting a mode (MD). The value "0" indicates the state in which burst mode can be used and the value "1" indicates the state in which non-burst mode can be used. The value of the address Add16 is set to "1" after the start sequence. The addresses Add17 and Add18 are used for setting data length (DL), which determines burst length (BL). The value "00" indicates a burst length BL of 8 words, the value "01" indicates a burst length BL of 16 words, the value "10" indicates a burst length BL of 32 word, and the value "11" indicates a continuous burst. The addresses Add19 and Add20 are used for setting partial mode (PM). That is to say, the addresses Add19 and Add20 determine how many megabits of data of the entire memory will be held. The value "00" indicates that 16 megabits of data will be held, the value "01" indicates that 8 megabits of data will be held, the value "10" indicates that all the data will be held, and the value "11" indicates that no data will be held. The value of the addresses Add19 and Add20 is set to "11" after the start sequence.

Addresses other than Add12 through Add20 are all at the high level.

How to set the mode register will be described later.

By setting the above mode register, the mode setting control circuit 14 outputs a latency signal LTC and a burst length signal BL.

It is assumed that a control signal is input from the power-down control circuit 17 described later to power the semiconductor memory 1 down. If the value of the address Add12 which indicates whether the reset function (RS) has been set is "0," then the mode register is reset. If the value of the address Add12 is "1," then the mode register is not reset.

The burst address counter 15 generates an internal address signal IADD which follows an address signal ADD in synchronization with a timing signal from the timing control circuit 16. The number of times the burst address counter 15 generates an internal address signal IADD is smaller by one than burst length indicated by a burst length signal BL. Moreover, the burst address counter 15 stops count-up operation while it is receiving a burst address advance signal /ADV at the high level.

The timing control circuit 16 receives control signals from the arbitration circuit 11, the command decoder 12, and the burst control circuit 13 and outputs timing signals for controlling the operation of the burst address counter 15, the address latch 18, the address decoder 19, and the read/write amplifier 21. Moreover, when refresh operation is completed, the timing control circuit 16 outputs a refresh stop signal RSTPZ.

The power-down control circuit 17 receives a chip enable signal CE2 and outputs control signals to the refresh control circuit 10, the arbitration circuit 11, the command decoder 12, the burst control circuit 13, the mode setting control circuit 14, the burst address counter 15, and the timing control circuit 16 to control power-on, power-down, or standby mode.

The address latch 18 latches an address signal ADD in synchronization with an address latch signal ELAT, latches an internal address signal IADD in synchronization with an address latch signal ILAT, and outputs the latched signals to the address decoder 19.

The address decoder 19 decodes address signals the address latch 18 latched and outputs a signal for selecting a memory cell MC in the memory cell array 20. To be concrete, the address decoder 19 outputs a word line signal for selecting a word line WL described later and a column line signal for turning on a column switch SW described later in response to an address signal ADD.

The memory cell array 20 includes a plurality of volatile memory cells MC arranged like a matrix, a plurality of word lines WL and a plurality of bit lines BL connected to these memory cells MC, a plurality of sense amplifiers SA connected to these bit lines BL, and a plurality of column switches SW each of which connects a bit line BL to the read/write amplifier 21. Each memory cell MC is the same as the one used in an ordinary DRAM and includes a capacitor for holding data as electric charges and a cell transistor located between the capacitor and a bit line BL. The gate of the cell transistor is connected to a word line WL.

The column switches SW are divided into a first column switch group corresponding to an upper byte signal /UB and a second column switch group corresponding to a lower byte signal /LB. At burst write operation time, the first column switch group turn on in response to an address signal only when an upper byte signal /UB is at the low level. At burst write operation time, the second column switch group turn on in response to an address signal only when an lower byte signal /LB is at the low level. That is to say, data to be written will be masked by controlling the column switches SW.

Actually, the timing control circuit 16 makes the address decoder 19 operate in response to an upper byte signal /UB or a lower byte signal /LB and the address decoder 19 outputs a column selection signal CL. As a result, the operation of the first column switch group and second column switch group will be controlled. Mask control is exercised over data to be written until the data to be written received at a data input-output terminal DQ is transmitted to the column switches SW.

The read/write amplifier 21 outputs data read in parallel from the memory cell array 20 to a data bus in synchronization with a read amplifier enable signal RAEN. The read/write amplifier 21 also outputs data to be written in parallel sent from the burst transfer register 22 to the memory cell array 20 in synchronization with a write amplifier enable signal WAEN.

The burst transfer register 22 includes a plurality of data registers (DT0, DT1, . . . ) for holding data. In non-burst mode, the burst transfer register 22 inputs data stored in a memory cell MC specified by an external address signal ADD via the read/write amplifier 21 and outputs it to a common data bus CDB. Moreover, the burst transfer register 22 holds data to be written sent from the common data bus CDB and outputs it to the read/write amplifier 21. In burst mode, the burst transfer register 22 converts data, which was read in parallel and which was sent from the read/write amplifier 21, into serial data and outputs it to the common data bus CDB in synchronization with a burst clock signal BCLK. Moreover, the burst transfer register 22 converts data to be serially written sent from the common data bus CDB into parallel data and outputs it to the read/write amplifier 21 in synchronization with a burst clock signal BCLK.

The data output control circuit 23 is activated at read operation time and outputs read data on a data bus DB to the 16-bit data input-output terminal DQ. When an upper byte signal /UB is at the low level, the data output control circuit 23 outputs the upper eight bits of 16-bit read data. When a lower byte signal /LB is at the low level, the data output control circuit 23 outputs the lower eight bits of 16-bit read data. The data input-output terminal DQ includes a first 8-bit data terminal group corresponding to an upper byte signal /UB and a second 8-bit data terminal group corresponding to a lower byte signal /LB.

The data input control circuit 24 is activated at write operation time. The data input control circuit 24 receives data to be written via the data input-output terminal DQ and outputs it to the common data bus CDB.

The burst transfer register 22, data output control circuit 23, and data input control circuit 24 operate as a data input-output circuit which can continuously input or output a plurality of pieces of data.

An address signal ADD, chip enable signals /CE1 and CE2, an address status signal /ADS, an output enable signal /OE, a write enable signal /WE, an external clock signal CLK, a burst address advance signal /ADV, an upper byte signal /UB, and a lower byte signal /LB are input from an external controller (not shown) via external terminals.

Now, operation performed in the semiconductor memory 1 described above and how to control the semiconductor memory 1 will be described in detail with the state transition diagram shown in FIG. 1.

The semiconductor memory 1 enters power-on mode (M1), then a chip enable signal CE2 goes into the low level. As a result, the arbitration circuit 11, the command decoder 12, the burst control circuit 13, the mode setting control circuit 14, the burst address counter 15, and the timing control circuit 16 are reset under the control of the power-down control circuit 17 (M2).

Next, the chip enable signal CE2 is changed to the high level and the semiconductor memory 1 enters standby mode of non-burst mode under the control of the power-down control circuit 17 (M3). In this mode, the command decoder 12 decodes a signal input from the outside and generates a control signal for changing the semiconductor memory 1 to a (read or write) mode corresponding to the result of the decoding.

FIG. 4 is a view showing an example of a command table.

In FIG. 4, "L" indicates that a signal is at the low level, "H" indicates that a signal is at the high level, and "X" indicates that a signal may be at the low level or at the high level. "$DQ_{0-7}$" indicates the lower eight bits of data at the data input-output terminal DQ and "$DQ_{8-15}$" indicates the upper eight bits of data at the data input-output terminal DQ. "HiZ," "Dout," "Din," and "Invalid" indicate the states of the data input-output terminal DQ. To be concrete, "HiZ" indicates that data is fixed at High-Impedance, "Dout" indicates data output, "Din" indicates data input, and "Invalid" indicates write inhibit or that data to be written is invalid as a result of masking. "Retention" indicates whether data is held, that is to say, whether refresh operation is performed. "Yes" indicates that refresh operation is performed. "No" indicates that refresh operation is not performed. "Partial" indicates that refresh operation is performed only on part of data.

The command decoder 12 selects a mode on the basis of a command table like the one shown in FIG. 4.

When a chip enable signal /CE1 and a write enable signal /WE are at the low level in standby mode (M3), the semiconductor memory 1 makes a transition to write mode (M4). When a chip enable signal /CE1 and an output enable signal /OE are at the low level and a write enable signal /WE is at the high level, the semiconductor memory 1 makes a transition to read mode (M5). When a chip enable signal /CE1 is at the low level and an output enable signal /OE and a write enable signal /WE are at the high level, the semiconductor memory 1 makes a transition to output disable (OD) mode (M6). When an upper byte signal /UB or a lower byte signal /LB goes into the high level in write mode (M4), the upper or lower bits of data to be written are masked and become invalid. Hereinafter this process will be referred to as Byte control. In read mode (M5), this Byte control is exercised and control is also exercised over an address signal ADD etc.

The transition from standby mode (M3) to mode M4, M5, or M6 has been described. However, the semiconductor memory 1 can make the transition from mode M4, M5, or M6 to each mode of non-burst mode according to a command decoded by the command decoder 12.

If commands are input in the following sequence in standby mode of non-burst mode (M3), the semiconductor memory 1 will make a transition to mode register set mode (M7) in which the mode register included in the mode setting control circuit 14 is set.

Figures 5A, 5B:
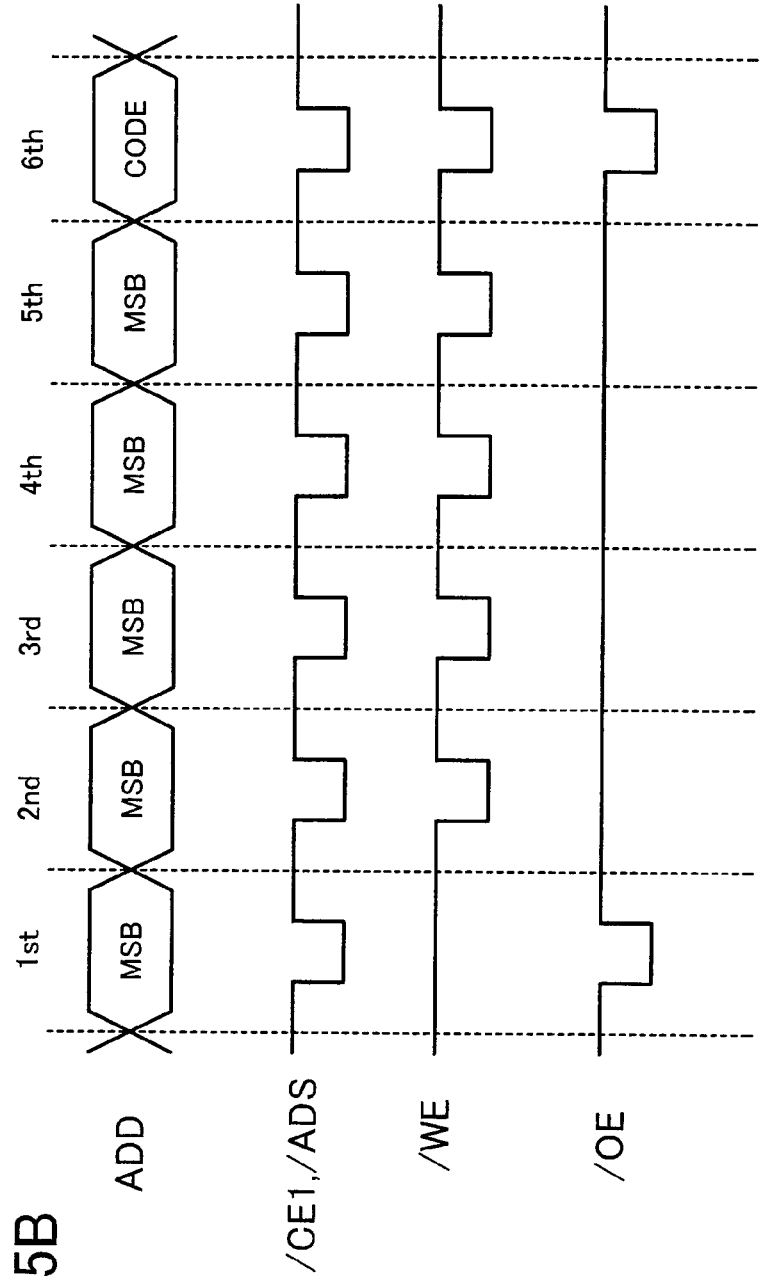
FIGS. 5A and 5B are views showing an example of sequence used for setting a mode register, FIG. 5A being a view showing combinations of a legal command (CMD) and an address (Add), FIG. 5B being a timing chart.

FIGS. 5A and 5B are views showing an example of sequence used for setting the mode register. FIG. 5A is a view showing combinations of a legal command (CMD) and an address (Add). FIG. 5B is a timing chart.

As shown in FIG. 5B, the mode register can be set by the use of six combinations of a legal command and an address as sequence. That is to say, a read command is input once, then a write command is input four times, and then a read command is input once. With addresses, the most significant bit (MSB) is input five times and finally a code (CODE) for setting the mode register shown in FIG. 3 is input.

If an address signal ADD, a chip enable signal /CE1, an address status signal /ADS, a write enable signal /WE, and an output enable signal /OE are input to the mode setting control circuit 14 with the timing shown in FIG. 5B corresponding to FIG. 5A, then the semiconductor memory 1 makes a transition to mode register set mode (M7) and the mode register is set to the contents of a code, which is shown in FIG. 3 and which is input last.

If a code shown in the above FIG. 3A is input and the value of the address Add16 indicative of a mode is "0," then the semiconductor memory 1 makes a transition to standby mode of burst mode (M9). If the value of the address Add16 is "1," then the semiconductor memory 1 returns to standby mode of non-burst mode (M3).

When a chip enable signal CE2 goes into the low level in standby mode of non-burst mode (M3), the semiconductor memory 1 makes the transition from non-burst mode to power-down mode (M8). When the chip enable signal CE2 goes into the high level in power-down mode (M8), the semiconductor memory 1 returns to standby mode of non-burst mode (M3).

In standby mode of burst mode (M9), the semiconductor memory 1 makes a transition to write mode (M10), read mode (M11), or suspend mode (M12) according to a result obtained by the command decoder 12 decoding a signal input from the outside. The same is done in standby mode of non-burst mode (M3). In burst mode, however, the reading or writing of data with burst length specified by a burst length signal BL output from the mode setting control circuit 14 according to the value of the data length (DL) set in the mode register will be begun at a clock specified by a latency signal LTC output from the mode setting control circuit 14 according to the value of the read latency count (RLC) set in the mode register. When an address status signal /ADS goes into the high level in write mode (M10) or read mode (M11), the burst address counter 15 stops count-up operation. However, the semiconductor memory 1 remains in the original mode (M10 or M11).

When the same combination of external signals that changes the semiconductor memory 1 to output disable (OD) mode of non-burst mode (M6) is input, the semiconductor memory 1 enters suspend mode (M12). In this mode, burst read is discontinued. Whether the semiconductor memory 1 makes a transition to read mode (M11) depends on the level of an output enable signal /OE.

The transition from standby mode of burst mode (M9) to mode M10, M11, or M12 has been described. However, the semiconductor memory 1 can also make the transition from mode M10 to mode M9 or M11, from mode M11 to mode M9, M10, or M12, or from mode M12 to mode M9 or M11 according to a command decoded by the command decoder 12. When the semiconductor memory 1 makes a transition between write mode M10 and read mode M11, the address status signal /ADS is changed to the high level.

When a chip enable signal CE2 goes into the low level in standby mode of burst mode (M9), the semiconductor memory 1 makes the transition from burst mode to power-down mode (M8) under the control of the power-down control circuit 17. When the semiconductor memory 1 enters power-down mode (M8), the mode setting control circuit 14 resets the mode register. However, if the value of the address Add12 of the codes shown in FIG. 3, which indicates reset (RS) setting and which has been set in the mode register, is "1," then resetting the mode register is prohibited. Accordingly, the semiconductor memory 1 returns to standby mode of burst mode (M9).

To set the mode register in burst mode, the above way should be used. That is to say, the semiconductor memory 1 is changed first to power-down mode (M8). Then a chip enable signal CE2 is changed to the high level and the semiconductor memory 1 is changed to standby mode of non-burst mode (M3) under the control of the power-down control circuit 17. Commands are input in the above sequence in this mode and the semiconductor memory 1 is changed to mode register set mode (M7) under the control of the mode setting control circuit 14 to set the mode register. Afterward, the semiconductor memory 1 is changed to standby mode of burst mode (M9).

As described above, the semiconductor memory 1 is changed from burst mode, through power-down mode (M8), to standby mode of non-burst mode (M3). The mode register therefore can be set in the same sequence both in non-burst mode and in burst mode.

The semiconductor memory which can be switched from burst mode to non-burst mode or from non-burst mode to burst mode has been described. However, a semiconductor memory used only in burst mode can be changed from a standby state in burst mode to power-down mode and then can be controlled so that a mode register will be set. This is the same with the above semiconductor memory.

As has been described in the foregoing, in the present invention, to set a mode register included in a semiconductor memory which is operating in burst mode, the semiconductor memory is changed first to power-down mode to reset the contents of the mode register. Then the semiconductor memory is changed to standby mode of non-burst mode. If commands are input in predetermined sequence in this standby mode of non-burst mode, then the mode register is set. Therefore, the mode register can be set in the same sequence both in non-burst mode and in burst mode.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A method for controlling a semiconductor memory, the method comprising the steps of:
    changing the semiconductor memory from a burst mode, through at least a predetermined mode, to a standby mode of non-burst mode when setting a mode register for setting an operation mode in the burst mode;
    changing the semiconductor memory from the standby mode of the non-burst mode to a mode register set mode in the case of commands being input in a predetermined sequence in the standby mode of the non-burst mode; and
    setting the mode register according to external input.

2. A semiconductor memory comprising:
    a mode setting control circuit having a mode register for setting an operation mode in response to commands being input in a predetermined sequence in a standby mode of non-burst mode; and
    a power-down control circuit for changing the semiconductor memory from a standby mode of burst mode, through at least a predetermined mode, to the standby mode of the non-burst mode.

* * * * *